(12) United States Patent
Gittings et al.

(10) Patent No.: US 9,280,615 B2
(45) Date of Patent: Mar. 8, 2016

(54) FLOW RACK DESIGN SYSTEMS AND METHODS

(71) Applicant: Toyota Motor Engineering & Manufacturing North America, Inc., Erlanger, KY (US)

(72) Inventors: John B. Gittings, Walton, KY (US); Brian C. Feldman, Cincinnati, OH (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 51 days.

(21) Appl. No.: 14/027,546

(22) Filed: Sep. 16, 2013

(65) Prior Publication Data

US 2015/0081251 A1    Mar. 19, 2015

(51) Int. Cl.
*G06F 17/50* (2006.01)

(52) U.S. Cl.
CPC ..................................... *G06F 17/50* (2013.01)

(58) Field of Classification Search
CPC . G06F 17/50; G06F 17/5004; G06F 17/5009; G06F 17/5086; G06F 17/5095
See application file for complete search history.

(56) References Cited

U.S. PATENT DOCUMENTS

| | | | |
|---|---|---|---|
| 6,744,436 B1 | 6/2004 | Chairielison, Jr. et al. | |
| 7,536,283 B2 | 5/2009 | Potter et al. | |
| 8,275,583 B2 | 9/2012 | Devarajan et al. | |
| 2004/0010328 A1* | 1/2004 | Carson et al. | 700/90 |
| 2004/0181305 A1 | 9/2004 | Hertinger | |
| 2007/0021854 A1* | 1/2007 | Teng et al. | 700/97 |

FOREIGN PATENT DOCUMENTS

JP    2004246762    9/2004

OTHER PUBLICATIONS

DeGreve et al., A Workplace Design Expert System, 1987.*
Ergonomics Guidebook for Manual Production Systems, Version 3.0, Rexroth, Bosch Group, 2012.*
Kaljun, Improving Products' Ergonomic Value Using Intelligent Decision Support System, Journal of Mechanical Engineering 58 (2012) 4, 271-280.*
New Contents and Functions in MTpro version 3.4, Rexroth, Bosch Group, 2012.*
New Features in MTpro 3.1, Rexroth, Bosch Group, 2011.*
UNARCO Rack Engine Quote and Engineered Pallet Rack Design Program, Apr. 29 & May 2, 2013.*

* cited by examiner

*Primary Examiner* — Aniss Chad
(74) *Attorney, Agent, or Firm* — Dinsmore & Shohl LLP

(57) ABSTRACT

A method of providing a flow rack system design using a flow rack design application is provided. The method includes selecting a first tier menu item from a plurality of first tier menu items saved in memory using a computer. A second tier menu item is selected, wherein the second tier menu item has project level standards information associated with the second tier menu item saved in memory. A virtual flow rack system is generated using the computer, the project level standards information and parts information saved in memory.

20 Claims, 14 Drawing Sheets

Update Version Data

Matching Parts: 2228    Updates Ignored: 0

New: 1

| L-10 | Kanban # | Part # | Description | Sup Code | L | W | H | Full Tote Weight | Empty Tote Weight | Usage per Hour |
|---|---|---|---|---|---|---|---|---|---|---|
| SAAN 00 | 3599 | 757654801001 | MOULDING, RR DOOR WINDOW RR... | 9999J | 550 | 355 | 165 | 4.03 | 0.67 | 0.6 |

Modified: 4

| L-10 | Kanban # | Part # | Description | Sup Code | L | New L | W | New W | H | New H | Full Tot Weig |
|---|---|---|---|---|---|---|---|---|---|---|---|
| SAFN21 | 0008 | 510240E01100 | BRACKET SUB-ASSY, FR. SUSPENSIO | 0587A | 610 | | 381 | | 191 | | 10.0 |
| SRSOP04 | 3256 | 852074806000 | ACTUATOR, HEADLAMP WASHER, RH | 9999J | 360 | | 275 | | 160 | 165 | 2.5 |
| STCW01 | M317 | 754430E03000 | PLATE, BACK DOOR NAME, NO.3 | 0807C | 381 | | 305 | 381 | 102 | | 0.3 |
| STED01 | 3636 | 803332500100 | PLUG, PLATE | 9999J | 355 | 360 | 275 | | 165 | | 2.4 |

Removed: 3

| L-10 | Kanban # | Part # | Description | Sup Code | L | W | H | Full Tote Weight | Empty Tote Weight | Usage per Hour |
|---|---|---|---|---|---|---|---|---|---|---|
| SAFN 22 | X874 | 113610P02000 | COVER, FLYWHEEL HOUSING UNDER | 9999J | 381 | 305 | 102 | 7.88 | 0.68 | 0.2 |
| SAFN 22 | M380 | 894650E04000 | SENSOR, OXYGEN | 9999J | 610 | 381 | 279 | 10.62 | 2.22 | 0.2 |
| SAFN 23 | 3599 | 174510D14000 | GASKET, EXHAUST PIPE | 9999J | 381 | 305 | 102 | 4.32 | 0.67 | 0.5 |

RESET    UPDATE    CANCEL

FIG. 7

| Save Ctrl+S | | SAES 20 ▼ | View | Rack/Shelf Settings | L-10 Settings | | | | Output | | | |
|---|---|---|---|---|---|---|---|---|---|---|---|---|
| Total Parts Listed: 16 | ⚠ 56 Errors | | | | | | | | | 🔄 Refresh Ctrl+R | Error Checking ☑ | |
| Part # | Description | Sup Code | Full Rack # | Full Shelf # | Full Facing | Full Top Clearance | Full Stacked QTY | Full Rows QTY | Return Rack # | Return Shelf # | | |
| 733500E021CD | BELT ASSY, RR SEAT, OUTER RH | 1205A | 1 | 1 | Width | 100 | 1 | 1 | | | | |
| 862860E02000 | BRACKET, AMPLIFIER, NO. 2 | 7343A | 1 | 2 | Width | 100 | 1 | 1 | | | | |
| 734310E02000 | COVER RR SEAT BELT RETRACTION RH | 1205A | 1 | 1 | Width | 100 | 1 | 1 | | | | |
| 611410E01000 | GUSSET, FR BODY PILLAR, UPR. RH | 0922B | 1 | 2 | Width | 100 | 1 | 1 | | | | |

FIG. 9

Shelf Special Conditions

Rack

Shelf Angle

| Rack # | Shelf # | Shelf Angle |
|---|---|---|
| 1 | 1 | 2.39 |
| 1 | 2 | 2.39 |
| 1 | 3 | 2.39 |
| 1 | 4 | 2.39 |

Save   Cancel

| | A | B | C | D | E | F | G | H | I | J |
|---|---|---|---|---|---|---|---|---|---|---|
| 1 | Bill of Materials: SAES 20 | | | | | | | | | |
| 2 | | | | | Part Number | Part Symbol | Description | QTY | Length | LSA Height | Conveyance Height |
| 3 | Rack 01 - Creform | | | | | | | | | |
| 4 | | Frame | | | | | | | | |
| 5 | | | | | | | Line Side Leg - Curved | 2 | 1633mm | | |
| 6 | | | | | | | Conveyance Leg - Curved | 2 | 1669mm | | |
| 7 | | | | | | | Top | 2 | 588mm | | |
| 8 | | | | | | | Outer Support Leg | 2 | 1500mm | | |
| 9 | | | | | | | Angled Support | 2 | 1353mm | | |
| 10 | | | | | | | Front Angle Brace | 2 | 240mm | | |
| 11 | | | | | | | Bottom - Line Side | 2 | 451mm | | |
| 12 | | | | | | | Bottom - Center | 2 | 596mm | | |
| 13 | | | | | | | Bottom - Conveyance | 2 | 212mm | | |
| 14 | | | | | | | Bottom - Inner Frame | 2 | 717mm | | |
| 15 | | | | Shelf 1 - Supply | | | | | | | |
| 16 | | | | | | | Shelf Support | 5 | 717mm | 166mm | 244mm |
| 17 | | | | | | | Tote Guides | 2 | 1450mm | | |

FIG. 18

FLOW RACK DESIGN SYSTEMS AND METHODS

TECHNICAL FIELD

The present specification generally relates to computer-aided design systems and, more particularly, to computer-aided flow rack design systems and methods.

BACKGROUND

Flow racks are commonly used to store and/or transfer components, parts, etc. The flow racks may have a plurality of rollers so that components and/or component trays can be moved from one location to another location. Such racks can facilitate movement of the components and/or component trays from one location to another.

Plants, warehouses and other locations have their own space limitations or constraints. Flow racks may be designed to take into account such space constraints. Human factors and efficiencies may also be considered. Flow rack design systems and methods are needed that facilitate flow rack design, taking into account various factors, such as space limitations and ergonomics.

SUMMARY

In one embodiment, a method of providing a flow rack system design using a flow rack design application is provided. The method includes selecting a first tier menu item from a plurality of first tier menu items saved in a database memory using a computer. Each first tier menu item has location level standards information associated therewith. The location level standards information are associated with a preselected geographic location. A second tier menu item is added wherein the second tier menu item includes the location level standards information by default. The location level standards information is modified thereby generating project level standards information associated with the second tier menu item and the project level standards information is saved in the database memory. A parts list including parts information is utilized. A virtual flow rack system is generated using the computer, the parts information and the project level standards information.

In another embodiment, a method of providing a flow rack system design using a flow rack design application is provided. The method includes selecting a first tier menu item from a plurality of first tier menu items saved in memory using a computer. A second tier menu item is selected, wherein the second tier menu item has project level standards information associated with the second tier menu item saved in memory. A virtual flow rack system is generated using the computer, the project level standards information and parts information saved in memory.

In another embodiment, a method of providing a flow rack system design using a flow rack design application is provided. The method includes importing a part list into the flow rack design application. A preview image of a virtual flow rack system is generated using a computer and the flow rack design application. The flow rack design application uses standards information and parts information saved in memory in generating the preview image. An obstacle is displayed in the preview image.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 7 illustrates an exemplary update report that presents update information according to one or more embodiments described herein;

FIG. 9 illustrates an exemplary error checking feature and color-coded system according to one or more embodiments described herein;

FIG. 17 illustrates an exemplary form for modifying shelf angles according to one or more embodiments described herein; and FIG. 18 illustrates an exemplary bill of materials report according to one or more embodiments described herein.

DETAILED DESCRIPTION

Embodiments described herein generally relate to computer-aided flow rack design systems and methods. The flow rack design systems and methods described herein can enable a designer to create or update a virtual flow rack design that can be tailored to its environment or improved in a continuous or intermittent fashion, while keeping design particulars in the hands of the designer. The flow rack design systems and methods allow more emphasis on process flow, human factors and efficiencies when designing and building flow racks that will be used to store and position items on a plant floor or other location. A hierarchical standards approach may be utilized, which can reduce the need for mass input and the ability for quick changes and adjustments is enhanced, as will be described in greater detail below.

Figure 1:
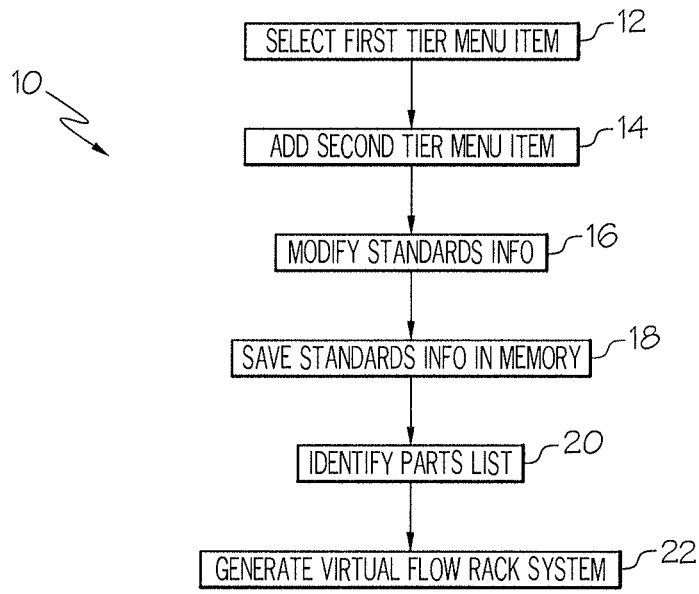
FIG. 1 is a computer and software-based method of providing a flow rack system design according to one or more embodiments described herein.

Referring to FIG. 1, a computer and software-based method 10 of providing a flow rack system design is illustrated. At step 12, a designer selects a first tier menu item, sometimes referred to as a location identifier, from a plurality of first tier menu items saved in a database memory using a computer. Each first tier menu item may have location level standards information associated therewith. As used herein, "standards information" refers to parameters (e.g., rack spacing, box clearance, rack height, etc.) in design of a particular flow rack system and/or its environment, such as within a plant, warehouse or other facility. As will be described, the parameters may be location specific (location level), specific to a project (project level) or independent/customized (rack and shelf level) or any combination thereof. The location level may relate to overall general standards, the project level may relate to a particular project standards and the rack and shelf level (sometimes referred to as line level) may relate to particular section standards. Thus, a three tier standards system may be provided where a user can customize a flow rack system design for a particular use.

Once a first tier menu item is selected, the designer can add or create a second tier menu item, sometimes referred to as a project identifier at step 14 that is associated or falls within the first tier menu item. Initially, the second tier menu item may have the location level standards information associated therewith by default. Such an arrangement can reduce the amount of data entry required by allowing use of default values that are associated with a particular location. The designer can then modify the location level standards information to generate project level standards information, as needed, associated with the second tier menu item at step 16. The project level standards information associated with the second tier menu item can be saved in memory at step 18.

Once the project level standards information is generated (and/or the location level standards information by default), which can be used to build the flow rack system, a parts list including parts information saved in memory is identified at step 20. The parts list may be available, for example, from a spreadsheet saved in memory and associated with the location associated with the first tier menu item. The parts list may be pre-generated using any suitable spreadsheet application, such as EXCEL®, commercially available from Microsoft Corporation. The parts information and the project level standards may be used to generate a virtual flow rack system at step 22 using the computer and, for example, a computer-aided design tool, such as AUTOCAD®, commercially available from Autodesk, Inc.

Figure 2:
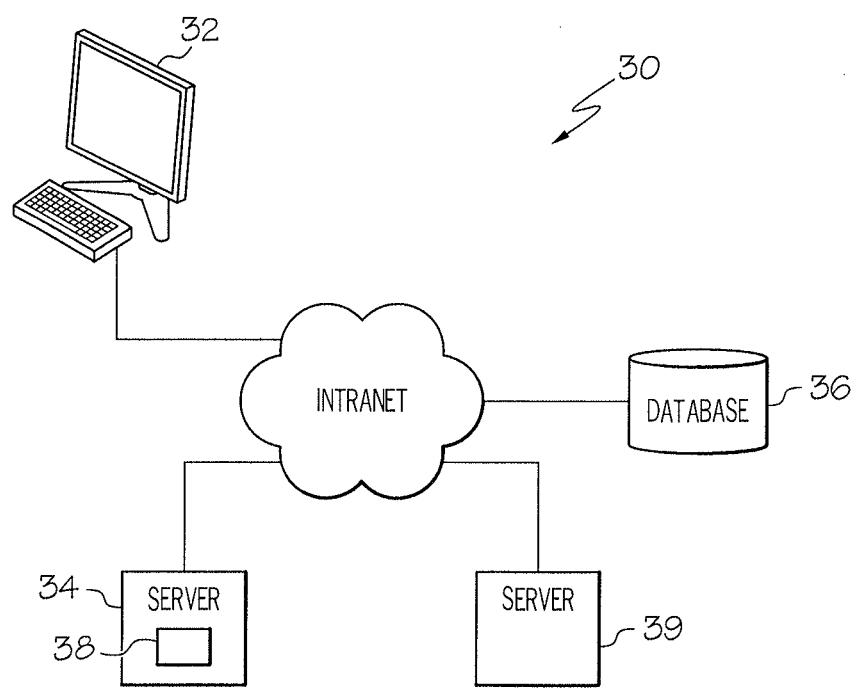
FIG. 2 illustrates a system for implementing the computer and software-based method of FIG. 1 according to one or more embodiments described herein.

Referring briefly to FIG. 2, a system 30 for implementing the computer and software-based method including the computer and software-based method 10 is illustrated as being implemented using a graphical user interface (GUI) that is accessible at a user workstation 32 (e.g., a computer), an application server 34, a database 36 and associated database server 39. While only one application server 34 is illustrated, the system 30 can include multiple workstations and application servers containing one or more applications that can be located at geographically diverse locations. In some embodiments, the system 30 is implemented using a wide area network (WAN), such as an intranet or the Internet. The workstation 32 may include digital systems and other devices permitting connection to and navigation of the network. Other system 30 variations allowing for communication between various geographically diverse components are possible. The lines depicted in FIG. 2 indicate communication rather than physical connections between the various components.

The system 30 includes a flow rack design application 38 that provides functionality for use in capturing, processing and maintaining flow rack design data by allowing the creation, review and approval of virtual flow rack designs. While the flow rack design application 38 is shown provided by the application server 34, the flow rack design application 38 may be provided locally at each workstation 32. The system 30 may also allow management or control of applications using, e.g., an authentication application to provide system security and/or to assign user permissions.

Figure 3:
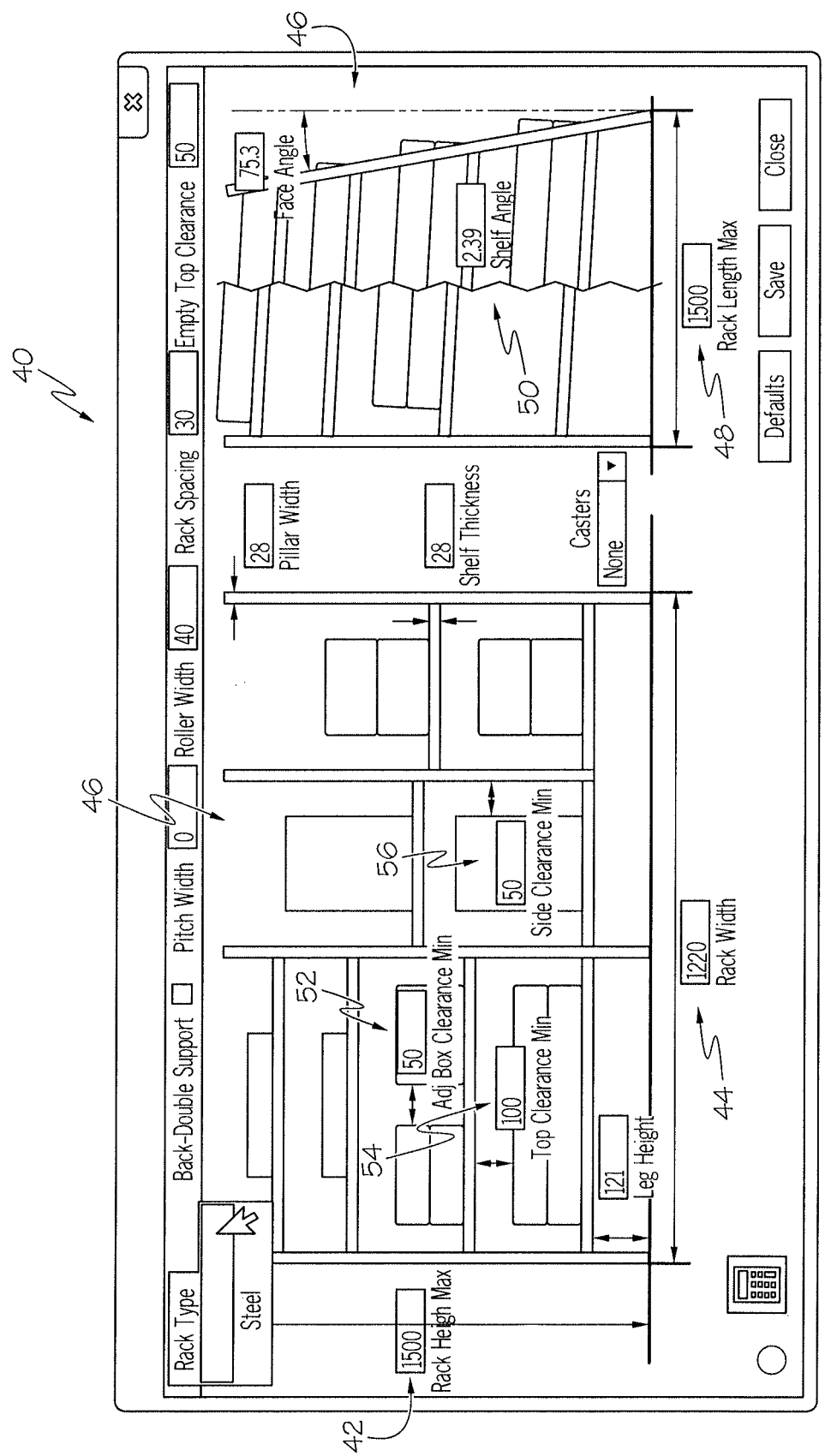
FIG. 3 illustrates an exemplary standards menu illustrating various design standards according to one or more embodiments described herein.

Referring to FIG. 3, an exemplary standards entry menu 40 illustrating various design standards is shown for a particular type of modular flow rack system (e.g., such as commercially available from Creform Corporation). As can be seen, fields (e.g., see fields 42 and 44) are provided that display values (standards information) that can be modified by the designer from their defaults or current values (e.g., location or project level). At least some of the fields can be mapped by the flow rack design application 38 to a visual representation of a flow rack system 46 to illustrate the dimension of the flow rack system 46 that the field is associated with. For example, field 42 (Rack Height Max) is associated with the maximum height of the built flow rack system, without totes, field 44 (Rack Width) is associated with the maximum width of the built flow rack system, field 48 (Rack Length Max) is associated with the maximum depth of the built flow rack system and field 50 (Shelf Angle) is associated with the angle of a shelf relative to horizontal. The fields illustrated are representative and there may be more or less fields allowing for customization of the flow rack system design. For example, in some embodiments, the ability to add, select between and remove casters is provided. The length dimensions shown are in millimeters, but inches may be selected. Conversion and angle calculators may be provided to facilitate units of measurement conversions and determination of shelf angles.

While many of the fields are associated with flow rack system dimensions, other fields may be provided to allow the user to control other parameters. For example, field 52 (Adj Box Clearance Min) is associated with the minimum distance between totes, field 54 (Top Clearance Min) is associated with the minimum distance from a top of a tote to the next shelf and field 56 (Side Clearance Min) is associated with the minimum distance between a tote and a side support structure. Control of such tote parameters can allow spacing for handling of the totes during actual usage of the flow rack system.

Figure 4:
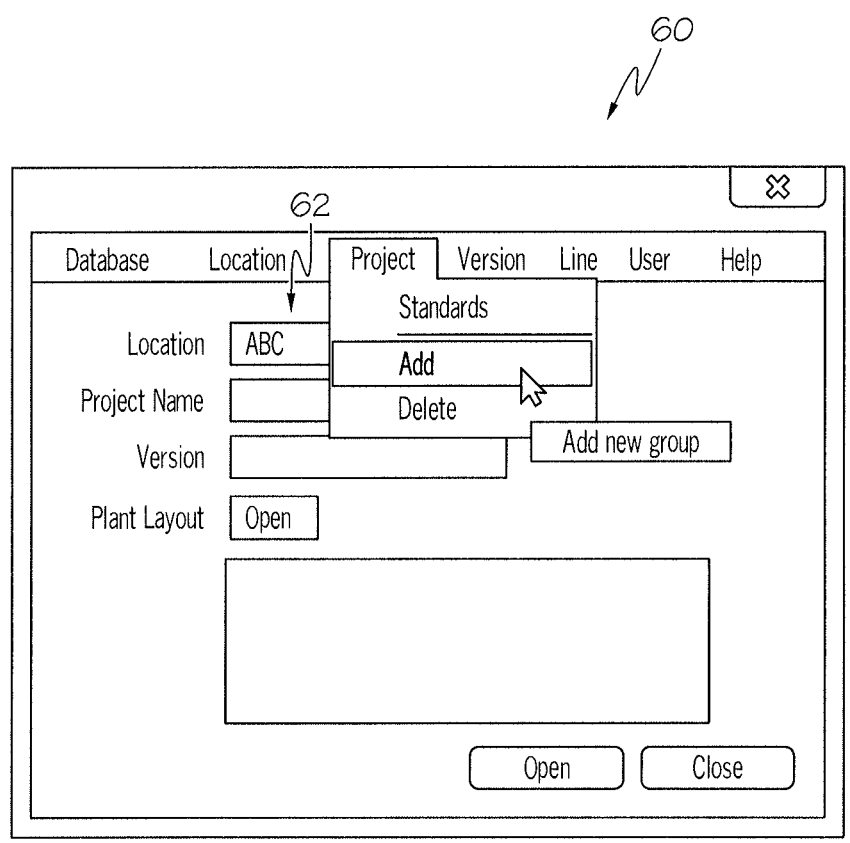
FIG. 4 illustrates an exemplary project menu that allows creation or change of information according to one or more embodiments described herein.
Figure 5:
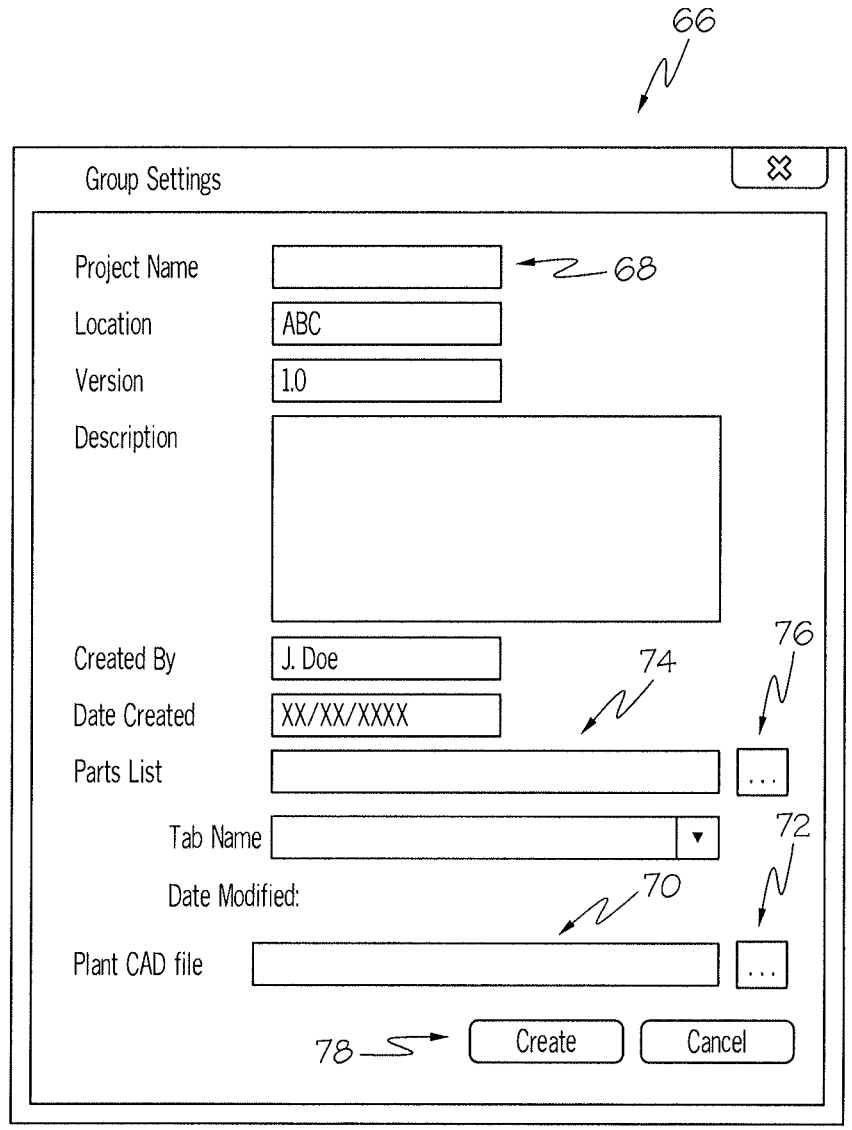
FIG. 5 illustrates an exemplary form for defining project settings according to one or more embodiments described herein.

FIG. 4 illustrates an exemplary project menu 60 that allows creation or change of group level information, including standards information. Once a location or first tier menu item is selected (see field 62), a group identifier or second tier menu item may be selected if one already exists. If a new project is needed, a second tier menu item may be added as shown by FIG. 4. FIG. 5 illustrates an example of a form 66 for defining project settings, such as a project name at field 68. It should be noted that a third tier menu item may also be selected under the Line tab. A plant computer-aided design (CAD) file can be identified and located using field 70 and browse button 72. This can allow accessing of the plant CAD file corresponding to the selected location at a later time without additional searching. A parts list file may also be identified using field 74 and browse button 76. By actuating create button 78, the parts list file may be opened and the parts information imported into the flow rack design application 38.

Figure 6:
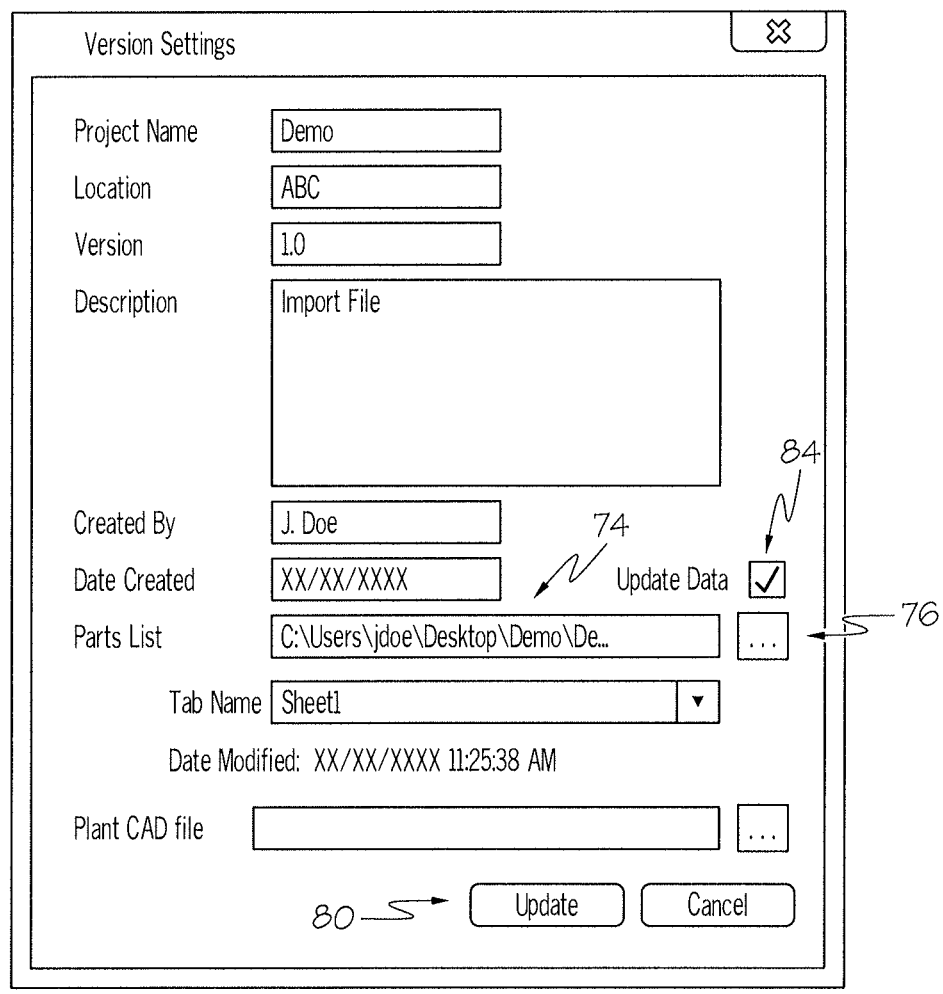
FIG. 6 illustrates a form for updating a parts list according to one or more embodiments described herein.

The parts list for the project may be modified or updated, for example, using an updated parts list. Referring to FIG. 6, an updated parts list can be identified by checking an update data box 84 and then using the field 74 and browse button 76. Actuating the update button 80 initiates another import process, similar to the import process for the original parts list.

The flow rack design application 38 may be used to compare the original and updated parts lists to highlight any changes for the user. Referring to FIG. 7, an exemplary update report 86 is illustrated that presents update information from a comparison between the original and updated parts lists. Update information may include, for example, matching parts 88, which is a count of the number of parts having no change, a new parts list 90 that shows any new parts in the updated parts list and a modified parts list 92 that shows any parts that are modified from the original parts list. If there are one or more parts modifications, the modifications may be reported in a new column 94. For example, in new column 94, a length of a tote including plugs is illustrated as having changed. Various tote dimensions, standards information and content information (e.g., weight) can be used in building the virtual flow racks, as will be described in greater detail below. A removed parts list 96 may be provided that reports the total number of parts that have been removed from the original parts list.

Figure 8:
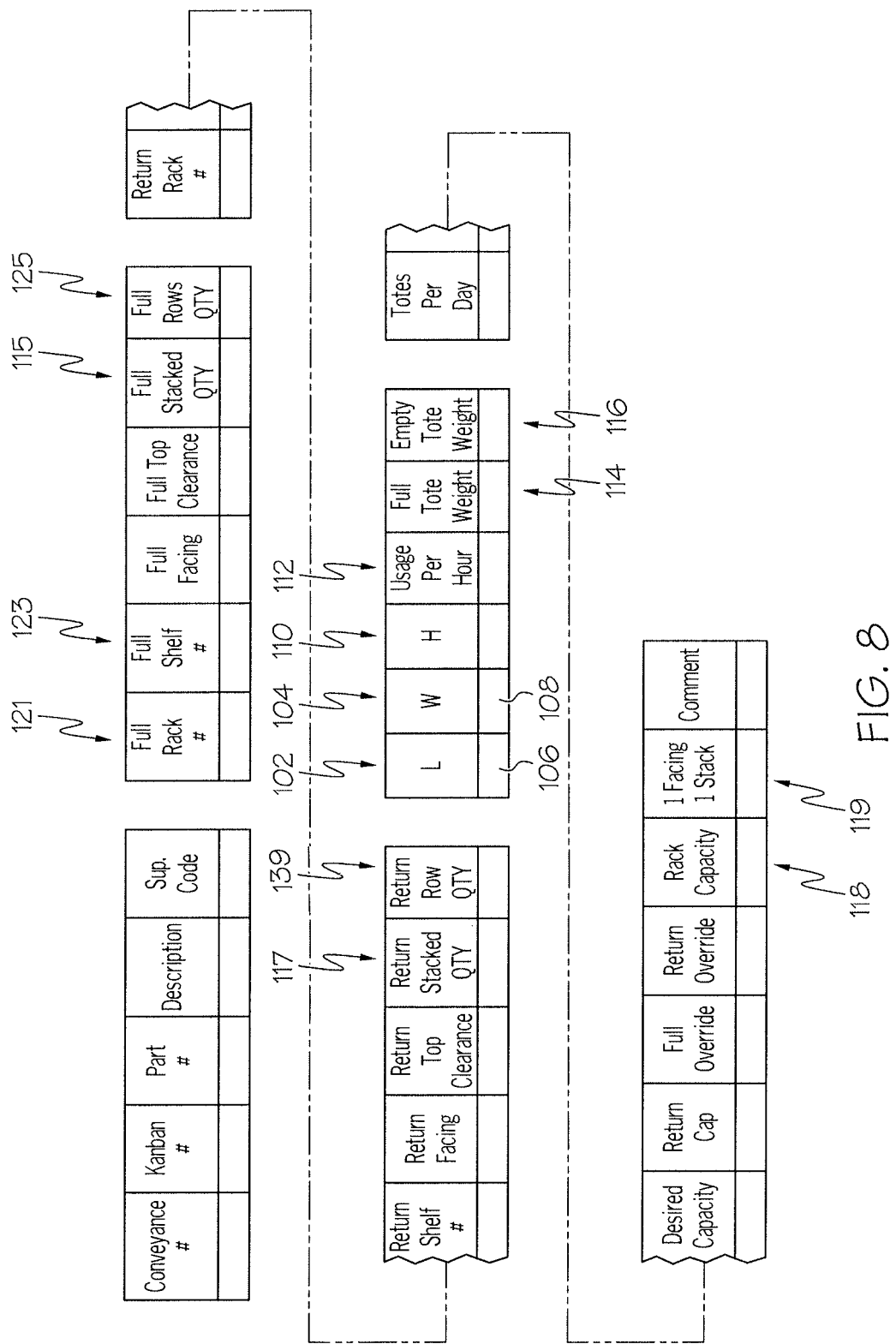
FIG. 8 illustrates an exemplary design view form according to one or more embodiments described herein.

Referring to FIG. 8, once the parts information and parts list are imported and updated, if needed, the parts information and standards information may be exported to a design view form 100 (see also FIG. 9). The design view form 100 includes multiple columns (e.g., see columns 102 and 104) with fields (e.g., see fields 106 and 108) that contain information that may be used by the flow rack design application 38 in generating a virtual flow rack design including the parts and parts information provided by the parts list. The columns may include design information from different sources, such as information imported directly from the parts list, calculated information (e.g., calculated during the export process by the flow rack design application 38), mandatory manual entry/edit information and optional manual entry/edit information. As examples of information imported directly from the parts list, column 102 (Length) includes the length of the tote for a part, column 104 (Width) includes the width of the tote for a part and column 110 (Height) includes the height of the tote for a part. Other examples of information imported directly from the parts list includes column 112 (Usage per Hour), which can be used to calculate, for example, totes per day (useful for ergonomic reasons), column 114 (Full Tote Weight) includes weight of the tote with full freight and column 116 (Empty Tote Weight) includes weight of an empty tote. As examples of calculated information, column 115 (Full Stacked QTY) calculates how many stacked totes are needed for a given number of totes, column 117 (Return Stacked QTY) calculates how many stacked return totes are needed for a given number of return totes, column 118 (Rack Capacity) calculates how many totes can fit on the flow rack and column 119 (1 Facing 1 Stack) calculates how many totes can fit on the flow rack with all totes facing a single direction in a single stack. Examples of manually entered information include column 121 (Full Rack #) is the rack number on which the tote is placed, column 123 (Full Shelf #) is the shelf number on which the tote is to be placed and column 125 (Full Rows QTY) is the number of facings or rows are desired, which is similar for Return Rows QTY in column 139 for return totes. The columns illustrated are exemplary and there may be more or less information to be entered, calculated and/or imported.

Referring to FIG. 9, as the design information is being imported, calculated and manually entered, an error checking feature 120 may be provided that looks for errors. Color coding may be used to highlight the various errors. For example, the lack of a value entered in a mandatory field may cause one or more error indicators, such as red text to be displayed. An errors calculation 124 may indicate a total number of errors detected.

Ergonomic information may also be displayed to the designer. For example, in FIG. 9 a color-coded system using different background field colors (e.g., red, yellow and green) may be used to provide the designer a visual indication of where the various totes should be positioned according to ergonomic standards, such as those provided by the National Institute for Occupational Safety and Health (NIOSH). NIOSH is the federal agency responsible for conducting research and making recommendations for the prevention of work-related injury and illness. In the example of FIG. 9, the belt assembly 126 and seat belt retractor cover 128 totes should be placed within a height range in the flow rack system associated with their color (red) and the bracket 130 and gusset 132 totes should be placed within a height range in the flow rack system associated with their color (e.g., yellow). Knowing the ergonomic standards, the designer can manually enter a value, for example, in the fields 134 (Full Shelf #) that allow for shelf placement of the totes.

Figure 10:
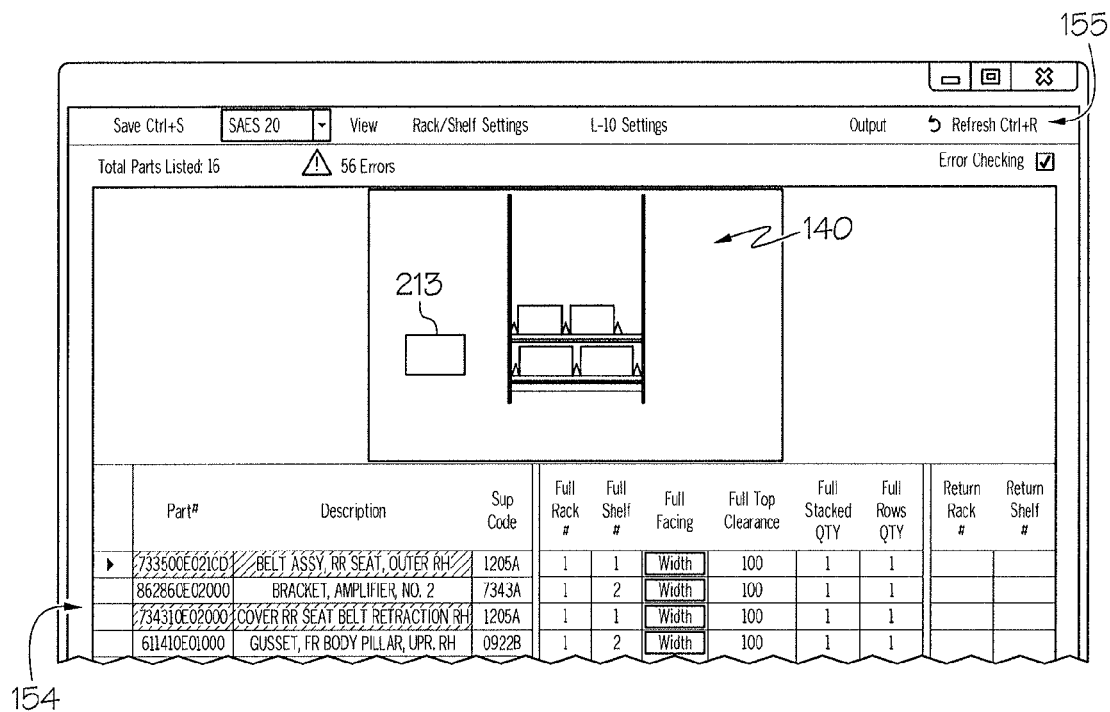
FIG. 10 illustrates an exemplary preview image displaying a virtual flow rack system according to one or more embodiments described herein.

Once the design information is imported, calculated and manually entered, the CAD tool may be used to generate a preview image of the flow rack system using the design information. Referring to FIG. 10, the preview image 140 may be a Portable Document Format (PDF) file that is generated using the CAD tool and displayed adjacent (e.g., above) the parts list and design information. For example, the PDF file may be created from a drawing (DWG) file generated by the CAD tool. The preview image 140 may be saved in memory, once created, for example, to allow the designer to view the preview image 140, even if a CAD tool is unavailable at a particular workstation. The preview image 140 may be zoomed in and out, panned, rotated and/or printed.

Figure 11:
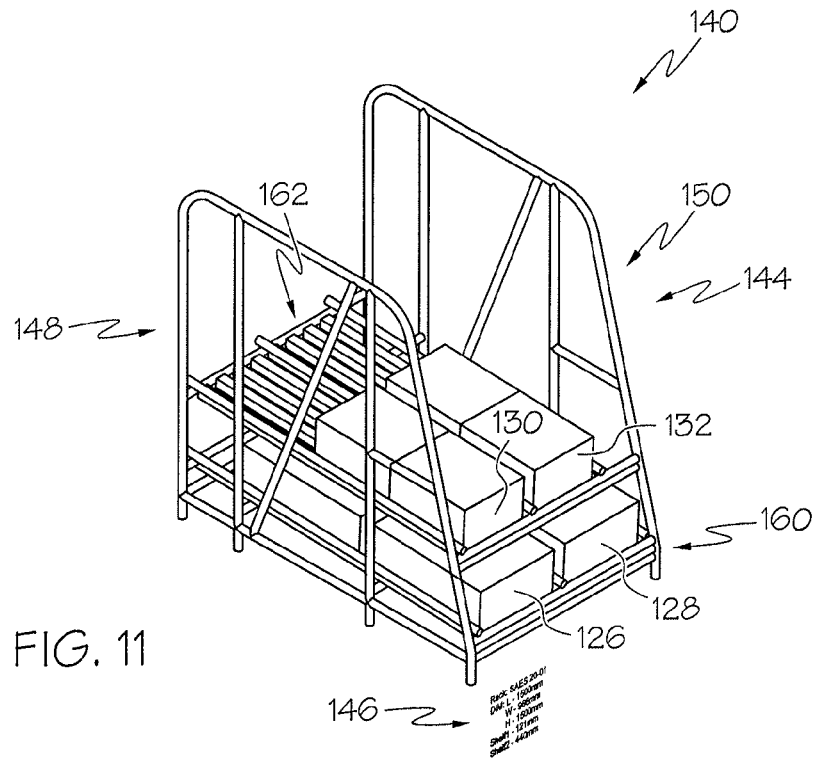
FIG. 11 illustrates the virtual flow rack system of FIG. 10 in isolation.

FIG. 11 illustrates the preview image 140 of virtual flow rack system 144 in isolation. The preview image 140 includes the virtual flow rack system 144 and flow rack system information 146 displayed adjacent the virtual flow rack system 144. The virtual flow rack system 144 includes side support assemblies 148 and 150 and shelf assemblies 160 and 162. Various engineering particulars (e.g., location and usage of various support bars, beams, fasteners, etc.) of the side support assemblies 148 and 150 and shelf assemblies 160 and 162 may be predetermined and built by the CAD tool based on, for example, the number of parts selected and their physical characteristics, such as size, weight and facing. In the illustrated example, a subset (e.g., four) of the parts list 154 is used to build the virtual flow rack system 144. As parts are added (and their associated totes), a refresh button 155 (FIG. 10) may be used to update the virtual flow rack system 144. As can be seen, the belt assembly 126 and seat belt retractor cover 128 totes are located on the bottom shelf assembly 160 and the bracket 130 and gusset 132 totes are placed on the upper shelf assembly 162. In some embodiments, the totes 126, 128, 130 and 132 each have a color that corresponds to their dictated ergonomic standard. For example, totes 126 and 128 may be illustrated red in color and totes 130 and 132 may be illustrated yellow in color.

The flow rack system information 146 is displayed adjacent the virtual flow rack system 144. In the illustrated example, the flow rack system information 146 is shown below the virtual flow rack system 144. In other embodiments, the flow rack system information 146 may be located above or to the side of the virtual flow rack system 144. In some embodiments, the flow rack system information 146 may move locations or move with the virtual flow rack system 144 as the virtual flow rack system 144 is moved or manipulated (e.g., rotated, panned, etc.). The flow rack system information may include dimensions of the flow rack system (e.g., length, width and/or height) and dimensions of the shelves (e.g., width and/or height).

Figure 13:
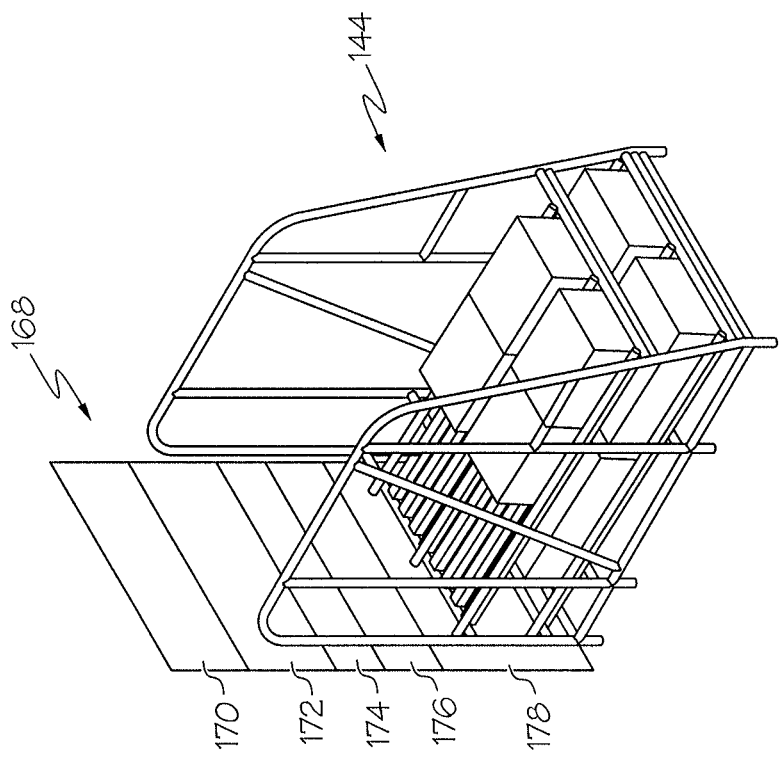
FIGS. 12 and 13 illustrate an exemplary ergonomic guide feature according to one or more embodiments described herein.
Figure 12:
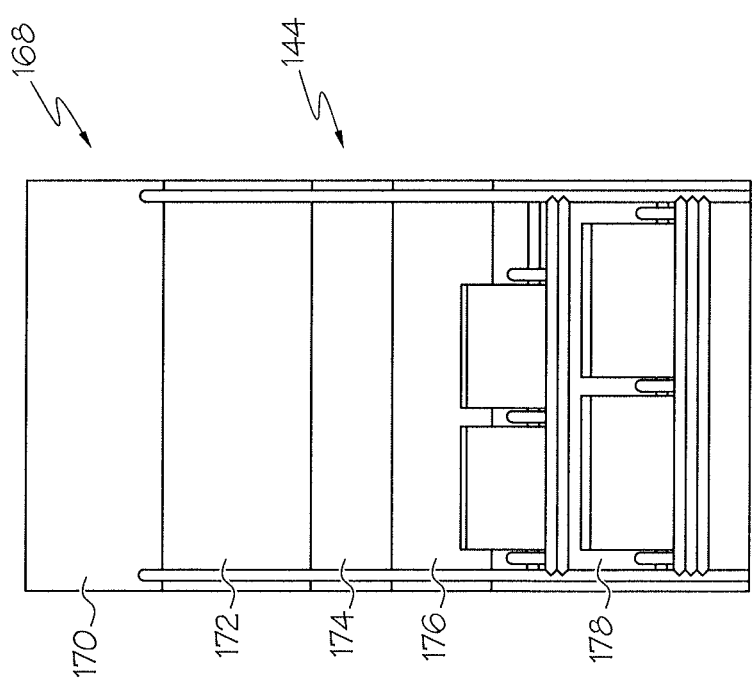
Figure 14:
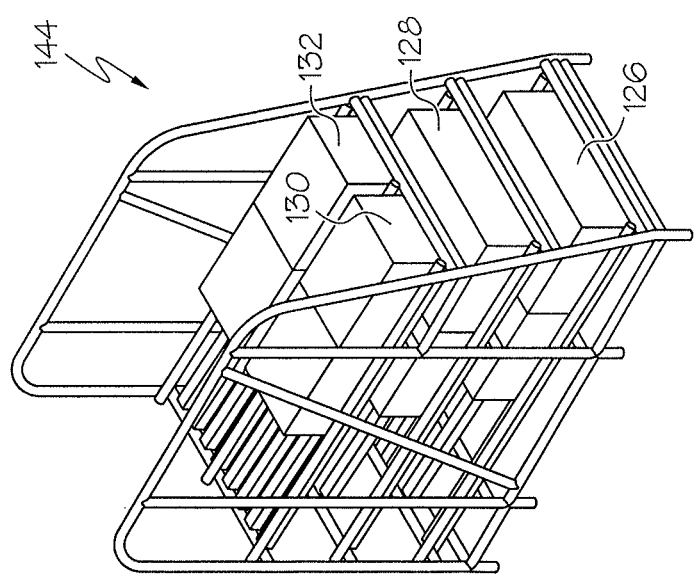
FIG. 14 illustrates a modification of the virtual flow rack system of FIG. 11.

Referring now to FIGS. 12 and 13, the flow rack design application 38 may include an ergonomic guide feature that, when enabled, visually displays an ergonomic guide 168 adjacent (e.g., behind) the virtual flow rack system 144. The ergonomic guide 168 can provide, for example, height ranges in which particular totes should be placed, based on ergonomic standards information. As one example, the ergonomic guide 168 may include indicator areas 170, 172, 174, 176 and 178 (e.g., in the form of horizontally extending bands) located at different vertical distances. The indicator areas 170, 172, 174, 176 and 178 may represent acceptable height ranges in which to locate the totes 126, 128, 130 and 132 based on ergonomic standards. The indicator areas 170, 172, 174, 176 and 178 may also be color-coded. In the illustrated embodiment, the indicator areas 170, 172, 174, 176 and 178 include a color that corresponds to or matches the available colors of the totes 126, 128, 130 and 132 to provide the designer an indication of where the totes should be placed according to the ergonomic standards. For example, indicator areas 170 and 178 may be red, indicator areas 172 and 176 may be yellow and indicator area 174 may be green. In this example, green totes should be placed at least partially within indicator area 174 (green), yellow totes (e.g., such as totes 130 and 132) should be placed at least partially within indicator areas 172, 176 or 174 (yellow or green) and red totes (e.g., such as totes 126 and 128) may be placed within any of the indicator areas 170, 172, 174, 176 and 178. Based on the tote arrangement of the virtual flow rack system 144, the designer can modify the current design. For example, FIG. 14 illustrates a modification of the virtual flow rack system 144 with the totes 126 and 128 turned length facing, which, in this instance, can improve density of the virtual flow rack system 144, while maintaining ergonomic standards.

Figure 15:
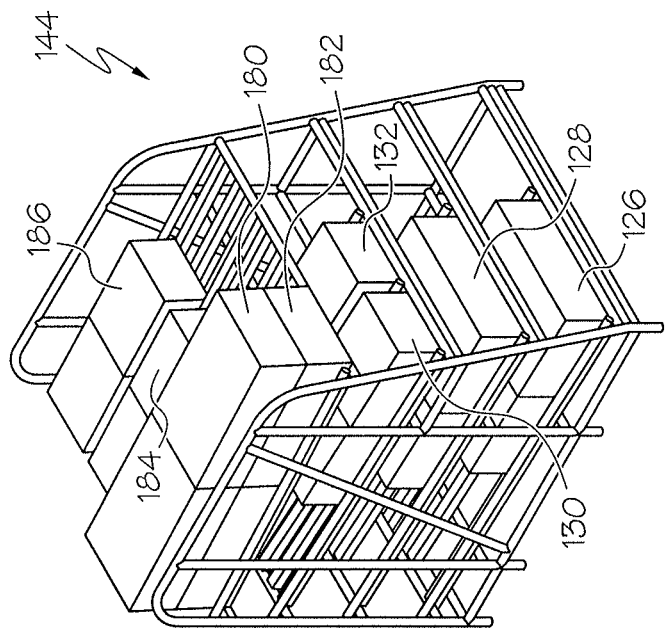
FIG. 15 illustrates a modification of the virtual flow rack system of FIG. 14 to handle tote returns.

The flow rack design application 38 may also provide the ability to design for the handling of return totes. For example, referring to FIG. 15, the virtual flow rack system 144 is modified to handle tote returns 180, 182, 184 and 186. The tote returns 180, 182, 184 and 186 represent emptied totes 126, 128, 130 and 132. By selecting an add returns feature, the flow rack design application 38 widens the virtual flow rack system 144 and adds a shelf assembly 188 for receiving the tote returns 180, 182, 184 and 186.

Figure 16:
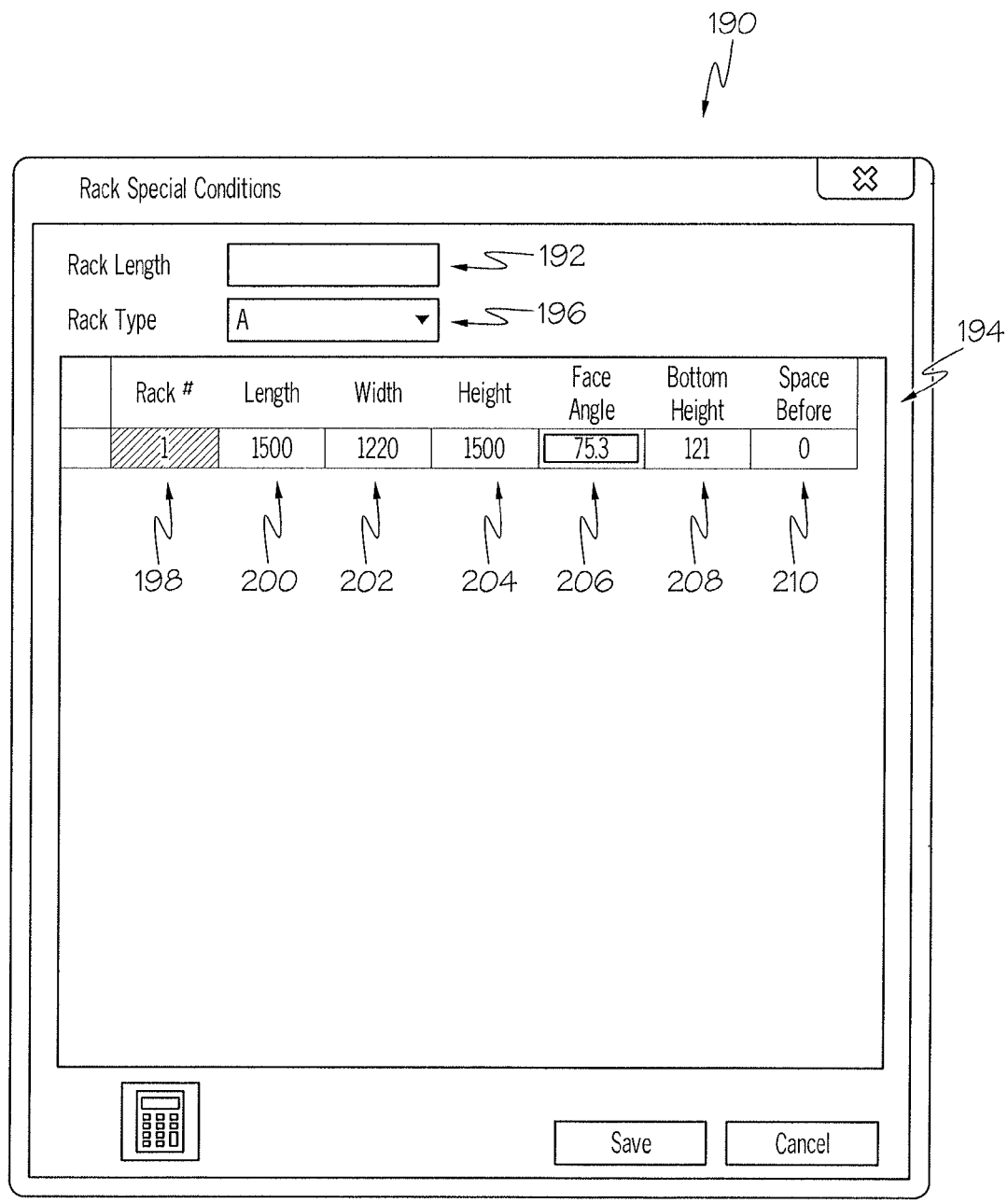
FIG. 16 illustrates an exemplary form for modifying the size and shape of a virtual flow rack system according to one or more embodiments described herein.

Referring to FIG. 16, a form 190 (Rack Special Conditions) may be provided that allows for modification of the size and shape of the virtual flow rack system 144 (e.g., from the default, location level standards information and/or project level standards information) after generation of the virtual flow rack system 144. For example, field 192 (Rack Length) allows the designer to enter a length value for all racks in a rack list 194 and field 196 (Rack Type) allows for selection of a flow rack system type from multiple flow rack system types. The form 190 also allows for individual flow rack system modifications. For example, field 198 (Rack #) indicates which flow rack system is being modified, field 200 (Length) allows for modification of the length of a specific flow rack system, field 202 (Width) allows for modification of the width of a specific flow rack system and field 204 (Height) allows for modification of the height of a specific flow rack system. Field 206 (Face Angle) allows the designer to change the angle of the face of a specific flow rack system (see FIG. 3), field 208 (Bottom Height) allows the designer to set the spacing of the bottom shelf from the floor of a specific flow rack system and field 210 (Space Before) can be used to provide space, e.g., for equipment and other obstacles such as columns, beams, etc. In some embodiments, obstructions 213 may be illustrated in the preview image 140 (FIG. 10) to provide the designer a visual representation of the location of the flow rack system relative to the obstruction. Referring briefly to FIG. 17, another form 212 (Shelf Special Conditions) may be provided that allows for modification of each shelf angle individually, by rack, or as a whole.

Referring to FIG. 18, the flow rack design application 38 may automatically generate a bill of materials 214, during or after the virtual flow rack system is designed, based on flow rack parts information saved in memory. The bill of materials 214 may include all parts, such as support legs, shelf supports, fasteners, couplings, etc. needed to build a particular flow rack system. The bill of materials 214 may not only include dimensional information, but also pricing information such that a total price can be calculated by the flow rack design application for a particular flow rack system.

The above-described computer-aided flow rack design systems and methods enable a designer to create or update a virtual flow rack design that can be tailored to its environment or improved in a continuous or intermittent fashion, while keeping design particulars in the hands of the designer. Relatively short design times can be used in creating a virtual flow rack design that meets manufacturing and ergonomic needs. A CAD tool can be used to generate a virtual representation of the flow rack system, which can then be modified by the designer and refreshed to update the virtual flow rack system. Environmental conditions, such as equipment or other obstacles can be taken into account in the virtual flow rack design and even visually represented to give the designer a visual indication of suitability of the virtual flow rack design in its particular environment.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of providing a flow rack system design using a flow rack design application to produce a usable, physical flow rack system for placement and use as designed in an industrial facility, comprising:

selecting a first tier menu item from a plurality of first tier menu items saved in a database memory using a computer, wherein each first tier menu item has location level standards information associated therewith, the location level standards information being associated with a preselected geographic location;

adding a second tier menu item wherein the second tier menu item includes the location level standards information by default;

modifying the location level standards information thereby generating project level standards information associated with the second tier menu item and saving the project level standards information in the database memory;

identifying a modifiable parts list comprising parts information;

generating a user interactive virtual flow rack system using the computer, the parts information and the project level standards information; and meeting ergonomic standards associated with the project level standards information such that the density of the virtual flow rack system is optimized.

2. The method of claim 1 further comprising modifying the project level standards information, and further comprising adding a third tier menu item wherein the third tier menu item includes line level standards information selected from a plurality of local level standards information saved in the database memory.

3. The method of claim 2, wherein the step of modifying the project level standards information includes changing at least one shelf angle of the virtual flow rack system to an angle offset from horizontal.

4. The method of claim 2, wherein the step of modifying the project level standards information includes changing spacing between adjacent totes located on the virtual flow rack system.

5. The method of claim 1 comprising displaying the virtual flow rack system using the computer as a preview image.

6. The method of claim 5 further comprising displaying an ergonomic guide within the preview image, wherein the ergonomic guide provides an indication of tote placement according to ergonomic standards.

7. The method of claim 6, wherein the ergonomic guide includes one or more color-coded indicator areas for visualization of at least tote placement.

8. The method of claim 7, wherein the virtual flow rack system includes one or more totes displayed thereon, the one or more totes being color-coded for visualization, wherein a first set of color-coded totes having a first color are placeable on a first height range in the flow rack system, wherein the first height range is associated with the first color.

9. The method of claim 5 comprising displaying an obstacle adjacent the virtual flow rack system in the preview image.

10. The method of claim 1 further comprising generating a bill of materials based on the virtual flow rack system using the flow rack design application.

11. A method of providing a flow rack system design using a flow rack design application to produce a usable, physical flow rack system for placement and use as designed in an industrial facility, comprising:

selecting a first tier menu item from a plurality of first tier menu items saved in memory using a computer;

modifying a first parts information saved in the memory to create an updated parts information and save the updated parts information in the memory;

generating a comparison of the first parts information and the updated parts information;

selecting a second tier menu item, wherein the second tier menu item has project level standards information associated with the second tier menu item saved in the memory; and generating a virtual flow rack system using the computer, the project level standards information and updated parts information saved in the memory; and meeting ergonomic standards associated with the project level standards information such that the density of the virtual flow rack system is optimized.

12. The method of claim 11 further comprising:

modifying the project level standards information;

checking for errors in the project level standards information and the updated parts information stored in the memory; and generating an error report including the total number of errors detected and one or more color-coded elements to highlight one or more detected errors.

13. The method of claim 12, wherein the step of modifying the project level standards information includes changing at least one shelf angle of the virtual flow rack system to an angle offset from horizontal.

14. The method of claim 12, wherein the step of modifying the project level standards information includes changing spacing between adjacent totes located on the virtual flow rack system.

15. The method of claim 11 comprising displaying the virtual flow rack system using the computer as a preview image.

16. The method of claim 15 further comprising displaying an ergonomic guide within the preview image, wherein the ergonomic guide provides an indication of tote placement according to ergonomic standards.

17. The method of claim 16, wherein the ergonomic guide includes one or more color-coded indicator areas for visualization, wherein the indicator areas are horizontally extending bands, wherein at least two horizontally extending bands are located at different vertical distances.

18. A method of providing a flow rack system design using a flow rack design application to produce a usable, physical flow rack system for placement and use as designed in an industrial facility, comprising:

importing a part list into the flow rack design application;

generating a modifiable preview image of a virtual flow rack system using a computer and the flow rack design application, the flow rack design application using standards information and modifiable parts information saved in memory in generating the preview image;

meeting ergonomic standards associated with the standards information such that the density of the virtual flow rack system is optimized;

displaying an ergonomic guide within the preview image, wherein:

the ergonomic guide provides an indication of tote placement according to ergonomic standards; and the ergonomic guide includes one or more color-coded indicator areas for visualization, wherein:

the indicator areas are horizontally extending bands; and at least two horizontally extending bands are located at different vertical distances; and displaying an obstacle in the preview image.

19. The method of claim 18, wherein the preview image is generated using a computer-aided design tool.

20. The method of claim 18 further comprising modifying the standards information and saving the modified standards information in the memory.

* * * * *